United States Patent [19]
Jeng et al.

[11] Patent Number: 5,441,013
[45] Date of Patent: Aug. 15, 1995

[54] METHOD FOR GROWING CONTINUOUS DIAMOND FILMS

[75] Inventors: Guang-kai D. Jeng, North Plainfield; James W. Mitchell, Somerset; Lawrence Seibles, Piscataway, all of N.J.

[73] Assignee: AT&T Bell Laboratories, Murray Hill, N.J.

[21] Appl. No.: 36,001

[22] Filed: Mar. 23, 1993

[51] Int. Cl.$^6$ .............................................. C30B 23/02
[52] U.S. Cl. .................... 117/109; 117/929; 423/446
[58] Field of Search ....... 423/446; 156/610, DIG. 68; 117/109, 929

[56] References Cited

U.S. PATENT DOCUMENTS 3,630,677 12/1971 Angus ................................. 423/446
3,705,937 12/1972 Dzevitsky et al. .................. 423/446

OTHER PUBLICATIONS

B. V. Spitsyn, et al. "Vapor Growth of Diamond On Diamond and Other surfaces" 52 J. Crystal Growth pp. 219-226 (1981) no month.
W. Piekarczyk, et al. "Diamond Deposition by Chemical Vapor Transport with Hydrogen in a Closed System" 106 J. Crystal Growth pp. 279-293 (1990), no month.
B. V. Spitsyn, "Chemical Crystallization of Diamond From The Activated Vapor Phase", J. Crystal Growth, vol. 99, pp. 1162-1167 (1990) no month.
L. L. Builov, et al. "Certain Characteristics Of The Growth of Diamond Layers from An Active Gas Phase", Dokl. Adad. Nauk SSR, vol. 287, No. 4, pp. 888-891 no month.
D. V. Fedoseev, et al. "Transition Of Graphic Into Diamond In A Solid Phase Under The Atmospheric Pressure", Carbon, vol. 21, No 3, pp. 237-241 (1983) no month.
W. Piekarczyk, "Application Of Thermodynamics To The Examination Of The Diamond CVD Process from Hydrocarbon-Hydrogen Mixtures", J. of Crystal Growth, vol. 98, pp. 765-776 (1989) no month.
W. Piekarczyk, et al. "Investigation of diamond by chemical vapor transport with hydrogen", Proc. SPIE, vol. 1325, pp. 30-40 (1990) no month.
B. V. Deryagin, et al. "Diamond crystal synthesis on nondiamond substrates", Sov. Phys. Dokl., vol. 21, No. 11, pp. 676-677 (1976) month unknown.

Primary Examiner—Robert Kunemund
Attorney, Agent, or Firm—Glen E. Books

[57] ABSTRACT

In contrast to previous approaches, the present inventors have discovered that diamond films can be grown by carbon CVT reactions occurring exclusively in the exothermic regime, where the lower temperature ($<1500°C$.) conditions considerably simplify the equilibrium gas phase chemistry. Under these conditions of a small temperature gradient and short transport distance between the source and substrate, supersaturation of the gas phase with regard to graphite and diamond does not attain sufficiently high values to induce spontaneous homonucleation of graphite and diamond in the gas phase. With this process, temperatures as low as 680°C. were found to be sufficient to induce the growth of continuous diamond films free of non-diamond allotropes.

6 Claims, 2 Drawing Sheets

METHOD FOR GROWING CONTINUOUS DIAMOND FILMS

FIELD OF THE INVENTION

The present invention relates to methods for growing diamond films, and, in particular, to a method of growing diamond films by chemical vapor transport which produces films of high purity compared to previously known processes.

BACKGROUND OF THE INVENTION

Diamond films are useful in a wide variety of applications such as providing heat sinks for microelectronic devices and cutting surfaces for industrial tools.

One known method for growing diamond films is by chemical vapor transport (CVT). CVT reactions of carbon for the deposition of diamond were reported by B. V. Spitsyn et al, 52 *J.Crystal Growth* 219–226 (1981). Subsequently, Piekarczyk and coworkers performed detailed thermodynamic analyses of the carbon-hydrogen binary system and examined carbon-hydrogen CVT theoretically in terms of a four-stage transport model. See W. Piekarczyk et at, 106 *J.Crystal Growth* 279–93 (1990). These investigators analyzed the solid-gas phase equilibria existing for graphite and diamond over a defined regime of pressure (0.1–10$^{-8}$ atm.) and temperature (850–3000K.) in a closed system of hydrogen. From the solubility plots for graphite and diamond in hydrogen versus temperature, they constructed a model for the transport cycle leading to diamond deposition. Using the model, Piekarczyk and coworkers evaluated data reported in the literature and confirmed experimentally that deposition of diamond could proceed readily from gas solutions undersaturated with respect to diamond.

The difficulty with these known processes, however, is that along with diamond, they also deposit substantial amounts of graphite. High temperatures (1350–1650 C.) were used to rapidly react the carbon source (graphite) with hydrogen for deposition of diamond on a substrate at 600–1100C. In such cases the gas phase is saturated with graphite at even higher levels than for diamond. Thus, the certain deposition of graphite with respect to diamond occurs according to the reverse of the reaction

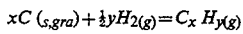

$$xC_{(s,gra)} + \tfrac{1}{2}yH_{2(g)} = C_x H_{y(g)}$$

The result, indicated by Raman spectra, is low quality film including high levels of graphite. Accordingly, there is a need for an improved process for depositing thin films of high purity diamond.

SUMMARY OF THE INVENTION

In contrast to previous approaches, the present inventors have discovered that diamond films can be grown by carbon CVT reactions occurring exclusively in the exothermic regime, where the lower temperature (<1500 C.) conditions considerably simplify the equilibrium gas phase chemistry. Under these conditions of a small temperature gradient and short transport distance between the source and substrate, supersaturation of the gas phase with regard to graphite and diamond does not attain sufficiently high values to induce spontaneous homonucleation of graphite and diamond in the gas phase. With this process, temperatures as low as 680 C. were found to be sufficient to induce the growth of continuous diamond films free of non-diamond allotropes.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
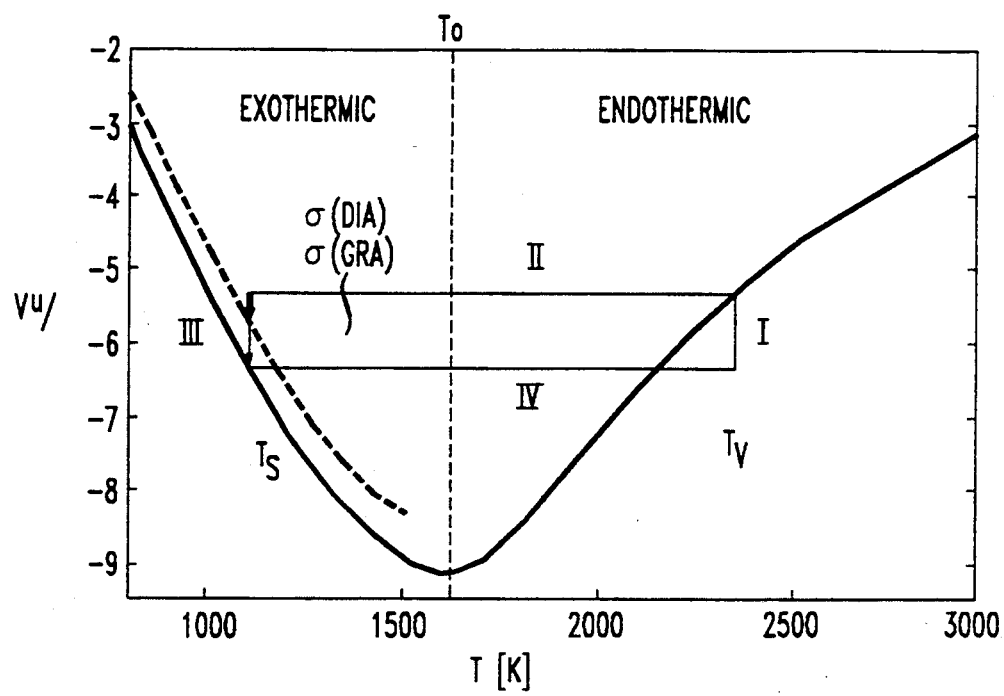
FIG. 1, which is prior art, is a graphical illustration showing the solubilities of graphite and diamond in hydrogen as a function of temperature.

Referring to the drawings, FIG. 1 is a solubility plot for graphite and diamond in hydrogen at 0.1 atm versus temperature. For convenience of reference the plot has been bifurcated at the temperature To of the minimum in the graphite solubility curve. The region T>To is the endothermic region and To<T is the exothermic region.

The FIG. 1 plot has been annotated to illustrate the major features of the conventional process for growing diamond films. In essence, the conventional process consists of an unlimited recurring sequence of cycles, where a single cycle consists of four successive stages:

I. Gasification of the solid in the gasification zone at temperature Tv;

II. Migration of the gas solution formed in stage I to the deposition zone;

III. Deposition of the solid in the deposition zone at temperature Ts; and

IV. Migration of the gas solution formed in stage III to the gasification zone.

As can be seen in the plot, the reactions of stage I take place at a high temperature Tv in the endothermic region and the gas is transported across a large temperature gradient to deposit at Ts. The result is the certain deposition of graphite in diamond.

The present inventors have discovered that continuous diamond films of high purity can be grown by maintaining both the carbon source and the substrate at temperatures in the exothermic range. Thus, their method for growing diamond film on a substrate comprises, in essence, the steps of providing a substrate, placing the substrate in a hydrogen gas ambient in the presence of elemental carbon (graphite), forming in the hydrogen gas a plasma contacting both the carbon and the substrate; and maintaining both the carbon and the substrate at a temperature in the exothermic range (T<To). Preferably the temperatures of both the carbon and the substrate are less than 1500° C. and advantageously less than 800° C.

Figure 2:
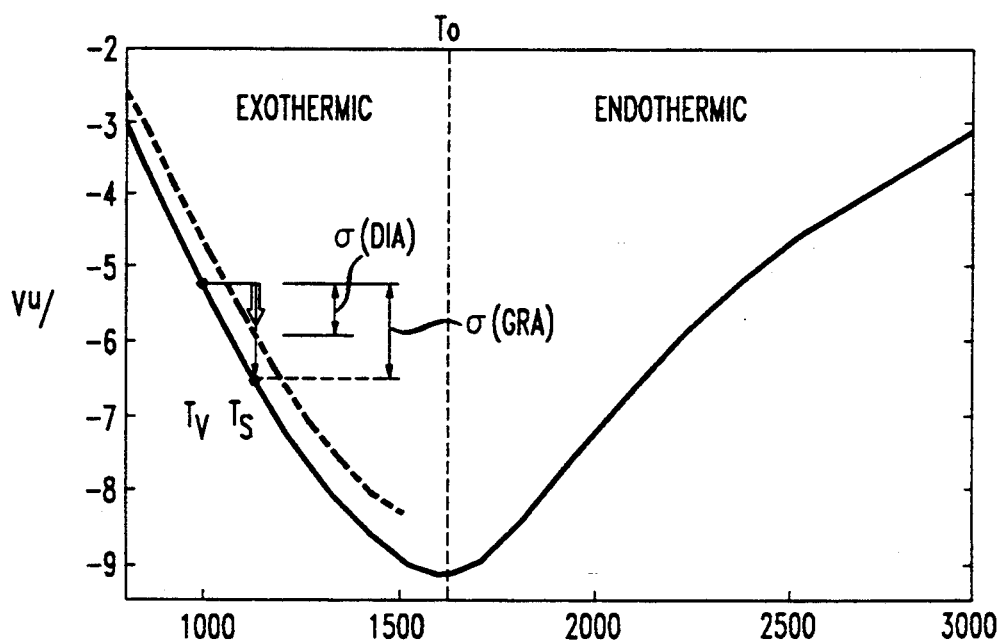
FIG. 2 is a schematic diagram of preferred apparatus used in depositing diamond films in accordance with the invention.

FIG. 2 is a solubility plot similar to FIG. 1 but annotated to illustrate the improved method of the invention.

As can be seen, To is in excess of 1500° K and the process takes place in the exothermic region below To.

Figure 3:
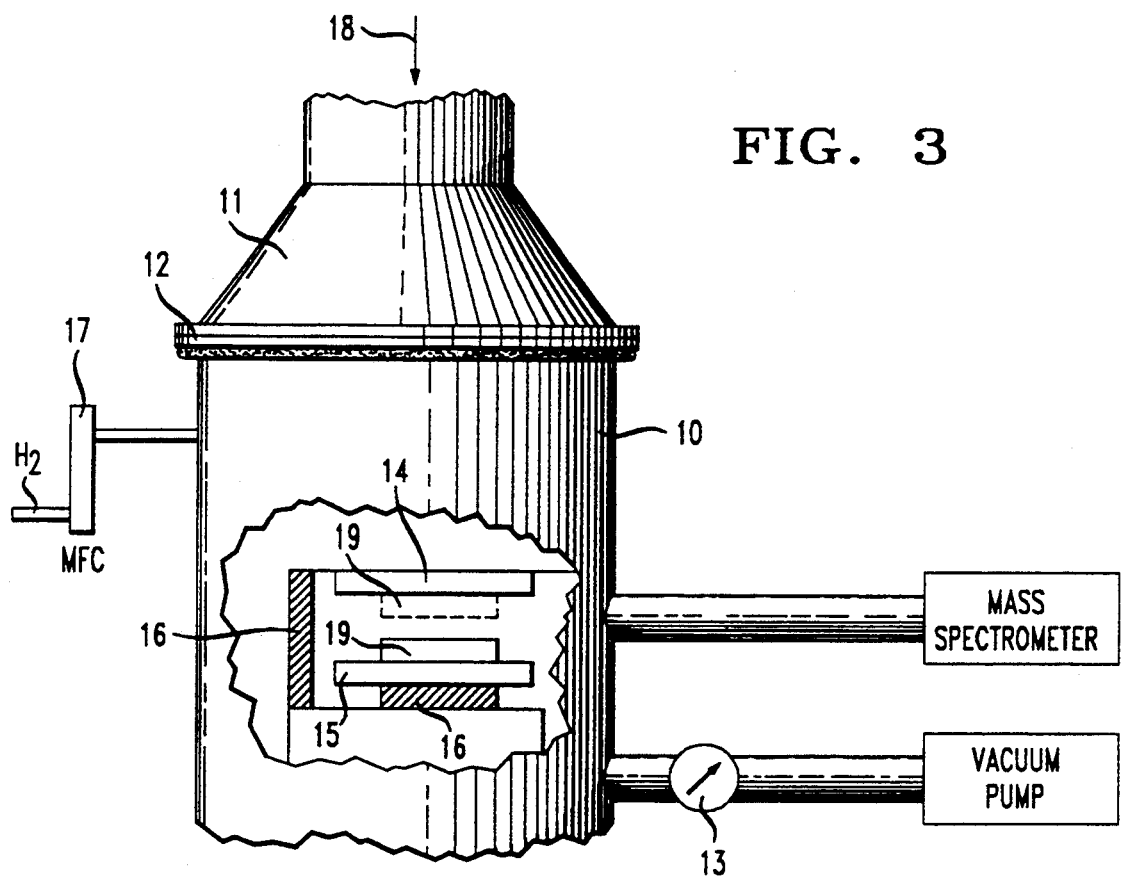
FIG. 3 is a graphical illustration showing the solubilities of graphite and diamond in hydrogen as a function of temperature. The graph is useful in showing the temperature regime of the present invention.

FIG. 3 shows preferred apparatus for depositing diamond films in accordance with the invention. The main reactor chamber 10 is vacuum-sealed from the upper section 11 by a quartz window 12 and the chamber pressure is maintained by a high vacuum pump (not shown) and regulated by a downstream feedback-controlled throttle valve 13 which is also connected to the mass flow control unit. The reactor utilized two graphite disks 14 and 15, which can be ⅛ inch thick and 1½ inch in diameter, with the lower disk placed directly on the bottom plate or elevated by a ceramic stand-off and the upper disk suspended above the lower one using a ceramic stand-off 16. The graphite disks were positioned geometrically concentric to the central vertical axis of the reactor 10 and the spacing between the disks can be varied between ¼ and 1 inch. A fixed distance of ¾ inch was used.

The method and utility of the invention can be understood in greater detail by consideration of the following specific example of the growth of a diamond film on a silicon substrate placed in the apparatus as shown in FIG. 3.

Pure hydrogen gas was introduced into the reaction chamber 10 and its feed rate was regulated by the mass flow control unit (not shown). The hydrogen flow rate was fixed at 200 sccm and the pressure varied from 45 to 95 torr. Microwave power 18 of 650W (2.45GHz), generated by a magnetron (not shown) was guided into the reactor through the quartz window. The graphite plates serve not only as the solid carbon source but also provide a compact microwave parallel-plate resonator. When the graphite spacing is well adjusted and the disks are aligned, the microwave plasma can be coupled between the plates with good confinement over the pressure range of 35 torr to at least 100 torr.

Square silicon <100> wafer sections, which can be 1 cm × 1 cm, were used as substrates 19. Prior to their use, the samples were abraided using diamond paste and thoroughly cleaned with acetone. In the single sample configuration, the silicon substrate 19 was located on the lower graphite disk and in a dual sample configuration silicon substrates 19 were attached to both disks. The temperatures of the silicon substrates and graphite disks were measured with an optical pyrometer (not shown). The loss in weight of the graphite disks was also determined by weighing after each run. Additionally, the effluent gas was also analyzed for volatile carbon specie under real time deposition conditions by use of a mass spectrometer interfaced downstream of the main CVT reaction chamber. Micro-Raman spectroscopy, optical and electron microscopy (SEM) were also utilized to assess the quality of the deposited diamond films.

The chemical vapor transport growth was conducted with a typical processing time of about 24 hours using the low temperature reaction of graphite with atomic hydrogen produced by the 650 W microwave plasma source. The coupled microwave power was well-confined between the two parallel-configured graphite plates and, each Si substrate which was in immediate contact with a graphite plate was immersed in the hydrogen plasma. The temperatures of the substrates, $T_s$, and graphite disks, $T_g$, measured for actual processing runs, are summarized in Table I:

TABLE I

Measurement of temperature (°C.) of the graphite disks and the silicon substrates

| Pressure (torr) | $T_{g1}$ | $T_{g2}$ | $T_{sub}$ |
|---|---|---|---|
| 45 | 680 | 725 | 820 |
| 55 | 726 | 761 | 869 |
| 65 | 765 | 813 | 901 |
| 75 | 839 | 884 | 957 |
| 85 | 891 | 932 | 1008 |
| 95 | 937 | 970 | 1045 |

For all process conditions the substrate temperatures were significantly higher than those of the graphite plates. As shown in Table I, all reaction temperatures were below $T_o$, the minimum solubility temperature point, indicating that the CVT process occurs in the exothermic regime. The partial pressures of the carbon and/or hydrocarbon specie generated at the graphite surfaces will reach a localized equilibrium at the graphite surface corresponding to the graphite temperature, $T_g$. Due to the higher substrate temperature, T s, the vapor phase, initially equilibrated at the graphite surface, becomes supersaturated after transport over the short distance to the substrate. Precipitation readily occurs on the substrate surface most likely because it has been pretreated with diamond seeds. It is much less likely that nucleation takes place in the gas phase because a much higher energy of formation will be needed for a homogeneous type of nucleation.

Diamond films produced in these studies were ~3 microns thick, continuous, pinhole-free and composed of well-formed crystals with predominately <111> and <100> facets.

Figure 4:
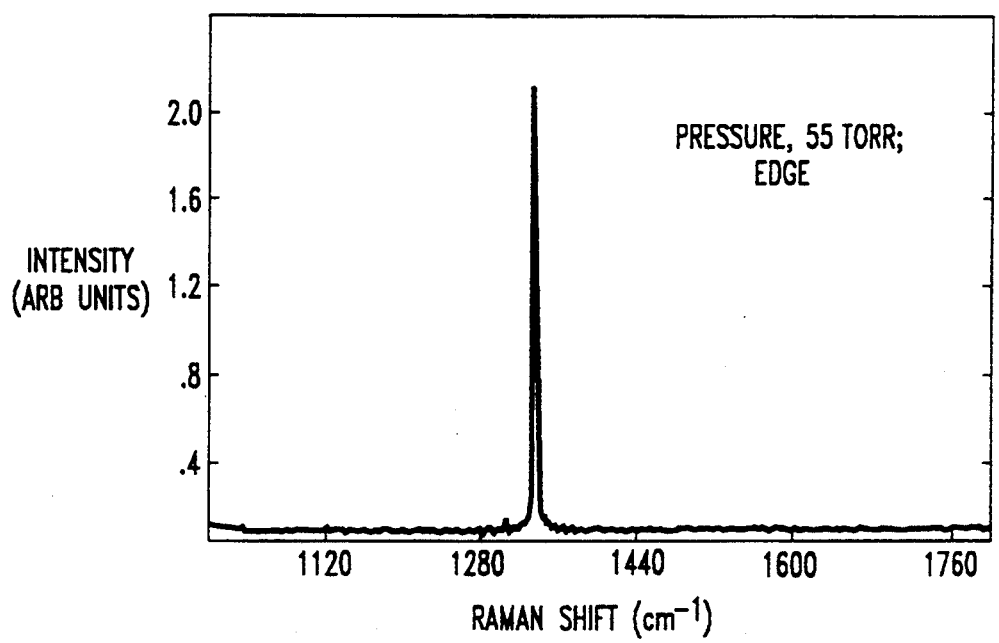
FIG. 4 is a Raman shift diagram illustrating the enhanced purity of diamond films grown in accordance with the invention.

The high purity of these films is illustrated by the narrow diamond Raman line shown in FIG. 4. The high quality films were grown at rates of 0.1 to 0.2 microns/hr. The diamond film quality improved remarkably on decreasing the hydrogen pressure from 95 to 55 torr as evidenced by a narrowing of the diamond Raman line at 1332 cm$^{-1}$ and the absence of detectable levels of non-diamond carbon. From the Raman data, we found the low levels of non-diamond carbon detected in the films at the higher pressures increased only slightly from the center to the edge of the substrate. Below 75 torr uniformly high quality was exhibited by all diamond films.

We have accomplished the growth of thick, high quality, continuous, pinhole-free diamond films from graphite by use of chemical transport reactions of carbon exclusively in the exothermic regime of the binary carbon-hydrogen system. In this case, carbon transport occurs by reaction of graphite with atomic hydrogen at low temperatures and migration over a short distance to a substrate at higher temperature where the gas phase becomes supersaturated with respect to diamond and graphite.

Our process in the exothermic region has several advantages over the prior processes in the endothermic region. First, the reaction takes place at a lower temperature. Second, carbon is transported upwards only a small temperature gradient (about 150° C.). Third, the solubility of carbon is a near-linear decreasing function temperature, and carbon concentration is easy to control. Fourth, there is a low probability of spontaneous-homogeneous reaction, and fifth, the chemistry is relatively simple.

It is to be understood that the above-described embodiments are illustrative of only a few of the many possible specific embodiments which can represent applications of the principles of the invention. For example, while the method has been described in relation to growing a diamond film on silicon substrates, other substrates can be used depending on the desired use of the films. Thus numerous and varied other arrangements can be readily devised in accordance with these principles without departing from the spirit and scope of the invention.

We claim:

1. A method for growing a diamond film on a substrate comprising the steps of:
providing a substrate;
placing the substrate in a hydrogen gas ambient in the presence of elemental carbon;
forming in said hydrogen gas a plasma contacting said carbon and said substrate;
maintaining said substrate and said carbon each at temperatures of less than about 1500° C.

2. The method of claim 1 wherein said substrate comprises silicon.

3. The method of claim 1 wherein said elemental carbon comprises graphite.

4. The method of claim 1 wherein said hydrogen gas is at a pressure of less than 75 torr.

5. The method of claim 1 wherein said substrate is at a higher temperature than said carbon.

6. The method of claim 1 wherein said substrate and said carbon are maintained at a temperature of less than about 800° C.

* * * * *